United States Patent
Arnold et al.

(10) Patent No.: US 8,362,772 B2
(45) Date of Patent: Jan. 29, 2013

(54) PROCESS AND CONTROL DEVICE FOR OPERATING A MAGNETIC RESONANCE IMAGING SCANNER

(75) Inventors: Thomas Arnold, Nuremberg (DE); Swen Campagna, Engelthal (DE)

(73) Assignee: Siemens Aktiengesellschaft, Munich (DE)

( * ) Notice: Subject to any disclaimer, the term of this patent is extended or adjusted under 35 U.S.C. 154(b) by 373 days.

(21) Appl. No.: 12/766,216

(22) Filed: Apr. 23, 2010

(65) Prior Publication Data

US 2010/0274118 A1 Oct. 28, 2010

(30) Foreign Application Priority Data

Apr. 24, 2009 (DE) .......................... 10 2009 018 876

(51) Int. Cl.
*G01V 3/00* (2006.01)

(52) U.S. Cl. .......................... 324/309; 324/307

(58) Field of Classification Search .................. 324/309, 324/307, 312, 314, 318, 322
See application file for complete search history.

(56) References Cited

U.S. PATENT DOCUMENTS

| | | | |
|---|---|---|---|
| 6,414,486 B1 | 7/2002 | Koellner et al. | |
| 6,741,672 B2 * | 5/2004 | Gaddipati et al. | 378/4 |
| 7,542,792 B2 * | 6/2009 | Wollenweber et al. | 600/407 |
| 7,906,964 B2 * | 3/2011 | Fleysher et al. | 324/309 |
| 8,030,920 B2 * | 10/2011 | Vu et al. | 324/307 |
| 2005/0063575 A1 * | 3/2005 | Ma et al. | 382/128 |
| 2005/0231203 A1 | 10/2005 | Feiweier et al. | |
| 2008/0024129 A1 | 1/2008 | Heid | |
| 2009/0066328 A1 | 3/2009 | Takahashi et al. | |

\* cited by examiner

*Primary Examiner* — Louis Arana
(74) *Attorney, Agent, or Firm* — Schiff Hardin LLP

(57) ABSTRACT

In a magnetic resonance imaging system having a scanner having a magnetic field system, a radio frequency system and a control device, and a method for operating such a system, the control device generates a control signal sequence on the basis of a control protocol for the purpose of executing a number of scan procedures and a number of adjustments for adjusting the magnetic field system and/or the radio frequency system, at least the scan procedures are predetermined by the control protocol. The control protocol furthermore contains a number of local scan transition indicators assigned to the scan procedures, and on the basis of the scan transition indicators, in each case the control device checks to determine if, directly prior to a scan procedure, an adjustment may be applied. The control signal sequence is then automatically generated by the control device such that, if for a scan procedure the necessary adjustment may not be applied prior to that scan procedure, then the relevant adjustment will be executed in advance and/or adjustment parameter values from previously executed existing adjustments will be used.

11 Claims, 3 Drawing Sheets

PROCESS AND CONTROL DEVICE FOR OPERATING A MAGNETIC RESONANCE IMAGING SCANNER

BACKGROUND OF THE INVENTION

1. Field of the Invention

The present concerns a magnetic resonance imaging scanner, containing a magnetic field system and a radio frequency system as well as a control device, and a method for operating such a scanner, wherein the control device generates a control signal sequence based on a control protocol in order to execute a number of scans and a number of adjustments for the purpose of adjusting the magnetic field system and/or radio frequency systems, wherein at least the scans are predetermined through the control protocol.

2. Description of the Prior Art

Magnetic resonance imaging has become a widely used method for capturing internal images of the body of an examination subject. With this imaging modality, the body to be examined is exposed to a relatively high static magnetic field, e.g. of 1.5 Tesla, which with newer, so-called high magnetic field apparatuses can be high as 3 Tesla. It is then exposed to a radio frequency excitation signal using an antenna device designed for this purpose, which causes nuclear spins of certain atoms to be excited by magnetic resonance when this radio frequency field is altered at a certain flip angle with respect to the magnetic field lines of the static magnetic field. The radiated radio frequency signal resulting from the relaxation of the nuclear spins, the magnetic resonance signal, is then detected with an antenna device designed for this purpose, which may be the same as the transmitting antenna device. The raw data acquired in this manner are then used for the reconstruction of the desired image data. A spatial encoding is superimposed on the static magnetic field during the transmitting and the reading out or detecting of the radio frequency signals by defined magnetic field gradients.

Accordingly, such magnetic resonance imaging scanners contain multiple subsystems that must be activated in a scanning procedure within a predetermined scanning sequence with regard to fixed temporal restrictions. This includes, among others, the above mentioned magnetic field system, which contains a static magnetic field system for generating the static magnetic field, as well as a gradient system for generating the magnetic field gradients, as well a radio frequency system, which contains not only the transmitting and/or receiving antennas, but also the radio frequency apparatuses and receiving channels used for operating the antennas and for processing the received signals.

A magnetic resonance imaging examination typically is composed of numerous independent separate magnetic resonance scanning procedures, e.g. for recording data at various positions within the machine of the patient, in order to acquire magnetic resonance data for different physiological processes or to excite different nuclei, etc. For each separate MRI scanning procedure, the subsystems must be prepared appropriately, and this is done through the adjustment readings. For example, the appropriate resonant frequency and the transmitter reference amplitude suited to an individual scan may be determined. Furthermore, there are numerous additional adjustments for other purposes such as for magnetic field homogenization, for water signal suppression, for setting sensitivity conditions etc. The adjustments are normally carried out by the magnetic resonance system or its control device independently prior to the diagnostic scan desired by the operator in each case. For this reason, the determination of adjustments is normally very specific with regard to the parameters of the actual scanning procedure. Furthermore, the adjustments are normally not only dependent on the magnetic resonance imaging scanner itself, but also on the specific object being examined because the physical conditions that exist within the magnetic resonance imaging scanner, specifically the homogeneity of the magnetic field and the radio frequency field, are significantly influenced by the object being examined.

Normally, the control device is given a specific sequence of scans by an operator using a control protocol that is created by the operator or that is selected from a number of predetermined control protocols that, when necessary, may be altered by the operator. For this purpose, certain adjustments (choices) may be included in the control protocol. Other necessary adjustments are in turn automatically added by the control device as well. A control signal sequence is then generated on the basis of the control protocol, which may then be executed in coordination with the various subsystems of the magnetic resonance imaging scanner, thereby executing the adjustments and the scanning procedures.

A typical example of a scanning sequence is shown in FIG. 2. Three consecutive scanning procedures $N_1$, $N_2$, $N_3$ are executed along a timeline t, each having two adjustments $J_{1.1}$, $J_{1.2}$, $J_{2.1}$, $J_{2.2}$, $J_{3.1}$, $J_{3.2}$. The adjustments $J_{1.1}$, $J_{1.2}$, $J_{2.1}$, $J_{2.2}$, $J_{3.1}$, $J_{3.2}$ in this case are then automatically inserted prior to the respective scans $N_1$, $N_2$, $N_3$ in each case.

A problem occurs when the scanning procedures are to be done consecutively without a pause. One example of this is scanning procedures that need to be executed within a limited period of time, after a contrast agent has been administered to the patient, and the concentration or diffusion of the contrast agent in a certain organ is to be examined using the image data acquired from the magnetic resonance imaging scanner. A similar problem may also occur with objects that move, for example when examining a heart in order to record images in a specific sequence of movement phases. When such scanning procedures should or must be executed directly in sequence, then the adjustments that are automatically executed by the system are disruptive, because the initiation of the subsequent scan intended by the operator is delayed.

A magnetic resonance imaging scanner is described in the DE 198 24 203 C2 with a means for solving this problem, which allows the application of adjustment parameters, which have been executed for another, earlier scanning procedure, to a subsequent scanning procedure, as long as the two scanning procedures are carried out under compatible conditions. Furthermore, it has been suggested in this document that all adjustments within an adjustment sequence be collected, the adjustment parameters be stored, and then all of the adjustments be executed in a subsequent data acquisition sequence.

This process, however, has the disadvantage of being relatively inflexible. Some scanning procedures may not need to be carried out directly in sequence such that an immediately preceding adjustment is possible. Alternatively, the entire scanning may be extended by the unnecessary prioritizing of the adjustments, for example when adjustments must be carried out precisely at the same patient table position as the scans. In this case, the table must pass through the various positions sequentially within the entered adjustment sequence and then again during the actual image data acquisition at a later time.

The result of this is that in practice a recycling of reusable adjustment parameters from previous adjustments is implemented in order to reduce the number of adjustments. A general prioritizing of all of the adjustments then does not occur. This means the current magnetic resonance imaging scanners are still configured such that the control device directs that necessary adjustments take place prior to a scanning procedure when no suitable adjustment parameters are available from previous adjustment readings.

If it is then the case that when a particular scan is to directly follow a previous scan, it is currently the practice is that an empirical determination is made, usually from the scanning protocol of the developer (i.e. the operator or specialist who develops the protocol for the user in advance), as to which of the remaining adjustments for a certain magnetic resonance imaging scanner are to be executed additionally in the processing of a scanning protocol. If it is then determined that, prior to a scanning procedure which is to be carried out directly after another scan procedure, an adjustment shall be executed by the control device, then a suitable previous scanning procedure is modified such than an analogous adjustment is carried out in advance so that the results of the necessary adjustments are available in the memory and thus can be reused, and the system dispenses with the insertion of the undesired adjustments. If a modification of a previous scan is not possible, then a replacement "scanning procedure" is inserted (that in itself is unnecessary), solely to obtain an adjustment reading.

A direct specification of the necessary adjustments for a specific point in time in advance in the scanning protocol by the scanning protocol developer is unfortunately not possible, because the systems are extremely complex and dependant on the machine type and system type, so that as many as 20 adjustments, depending on the scanning procedure, must be carried out in advance. For this purpose, it should be taken into consideration that the precise sequence and in what relationship and which adjustments should be automatically applied by the control device, is not easily identifiable by the operator or the scanning protocol developer due to the complexity of the system. In comparison, it is normally possible for an experienced operator to determine which adjustments need to be carried out in running the program in the framework of a test. For this reason, the developers of the scanning protocol must rely on the previously described empirical protocol development and testing, even when this requires significantly more additional work.

A further problem with a control protocol developed in this manner is that the adjustments are, as noted, system dependant, and this dependency may vary from one model to another by the same manufacturer, or may vary even in the case of system changes within a model. A control protocol developed for one magnetic resonance imaging scanner thus can not simply be used on another magnetic resonance imaging scanner without first checking whether, with the new magnetic resonance imaging scanner, it is the case when two scans that are executed consecutively without a break, no undesired additional adjustments are inserted through the modification of the scanning process. The described empirical method is also particularly critical because changes in the magnetic resonance imaging scanner can induce new adjustments which are not taken into consideration in the previous control protocol. In this case, a scan procedure can be delayed by an unintentionally implemented adjustment—in the worst case, even unnoticed. Such an unintentional or unnoticed adjustment also can lead to faulty results, or at least result in the entire scan needing to be repeated, which is furthermore unpleasant for the patient as well.

SUMMARY OF THE INVENTION

An object of the present invention is to develop a process for operating a magnetic resonance imaging scanner as well as a suitably designed magnetic resonance imaging scanner of the type described above that, in an uncomplicated manner, can ensure that predetermined scan procedures may be executed within the necessary time limits and so the total scan procedure as well as the inconvenience to the patient are kept to a minimum.

The control protocol of the procedure in accordance with the invention contains a number of scan transition indicators that are assigned to at least one scan by being embodied or embedded in the scan protocol for that scan. These scan transition indicators, for example, may be provided explicitly by the developer of the protocol. Various possibilities for such scan transition indicators will be explained below in detail. On the basis of the scan transition indicators, the control device will check whether a necessary adjustment for the scan may be applied directly before initiating that scan. The control device then automatically generates a control signal sequence such that, in the case where the necessary adjustment for a particular scan may not be applied, the adjustment is executed in advance and/or the adjustment parameter values of previously executed, other scanning adjustments are applied. In the second case, i.e. the reusing of adjustment parameters from previously executed adjustments, it is also advantageous (under the condition that the magnetic resonance imaging scanner is appropriately equipped), if it has been determined that in principle an adjustment may be applied prior to the scan, so in this manner the total time required can be reduced.

A significant advantage of the invention is that because of the local specifications for the relevant scanning procedure that is to be executed it is not required that all adjustments be implemented, but rather at certain points in the scan procedure adjustments that would interfere with the temporal running of the scan are suppressed or prevented from being implemented. In this manner, the flexibility of the system is significantly increased. As a result, the invention ensures that through the scan transition indicators, in each case assigned locally (individually) to the scan procedure, only those adjustments that are necessary are selectively implemented, rather than simply undertaking every adjustment, regardless of whether it results in unnecessary expenditure and additional inconvenience.

A further advantage of the invention is that the earlier described, presently standard empirical determination of magnetic resonance imaging scanner activity, and an adaptation of the control protocol based thereon resulting in an erroneous manipulation of the actual desired scanning procedure, can be entirely eliminated. Instead, the process of implementing adjustments on the basis of the scan transition indicators, which can be easily implemented in the data sequence of the scan protocol by the developer of the scanning protocol, is fully automated. In this manner, an optimization of the total scanning time is enabled. As long as the magnetic resonance imaging scanner is equipped with a suitable functioning control device, it is possible to transfer control protocols between magnetic resonance imaging scanners or to modify the magnetic resonance imaging scanner, without the risk that scan procedures will be unintentionally delayed by the insertion of new adjustments.

A magnetic resonance imaging scanner in accordance with the invention for implementing the method requires, aside from the typical magnetic field system and the radio frequency system, a control device, which normally contains a protocol interface for acquisition and/or selection of a control protocol and a control sequence-generating unit, which is designed such that it can generate a control signal sequence on the basis of a control protocol for the purpose of executing a number of scan procedures and a number of adjustments for adjusting the magnetic field system and/or the radio frequency system, wherein at least the scan procedure is predetermined by the control protocol. In accordance with the invention, this control unit must contain a scan transition checking unit, which is designed such that local scan transition indicators assigned to the scan procedure, which are embedded in the control protocol, are recognized and on the basis of the scan transition indicators the control unit checks in each case to determine if an adjustment directly prior to the scan may be applied. Furthermore, the control sequence-generating unit must be designed (configured) such that it automatically generates the control signal sequence so that in the case that the necessary adjustment may not be applied for the respective scan procedure, the appropriate adjustment is implemented in advance and/or the adjustment parameter value for another adjustment assigned to a previously executed scan is used. This means that the control sequence-generating unit therefore requires additional buffer circuitry that interacts with the scan transition checking unit so that only the adjustments that must be executed in advance actually will be selectively executed in advance, since they may not be executed directly prior to the respective scan and since no adjustment parameter values from other adjustment readings are available.

In order to enable a recycling of adjustment parameter values, the control unit contains or has access to a suitable memory, with the adjustment parameter values from adjustment readings being stored in the memory with key data referring to the associated scans, such that they can be retrieved for other scans.

The essential components of the control unit, particularly the control sequence-generating unit with the scan transition checking unit, may be implemented in the form of suitable software in a programmable control unit of a magnetic resonance imaging scanner. This has the advantage that existing magnetic resonance imaging scanners can be easily retrofitted to function with the process of the invention. Thus, the object of the invention may be accomplished through a computer-readable storage medium that can be loaded directly onto the memory of a programmable control device of a magnetic resonance imaging scanner, with program code for implementing all of the steps of the method of the invention when the program has been installed in the control device.

The scan transition indicators may be assigned to individual scan procedures such that, for example, they indicate in each case to what extent an adjustment is possible prior to the respective scan. It is also possible for a scan transition indicator to indicate to what extent an adjustment for the scan is suitable for subsequent scannings. An assignment of the scan transition indicators of this sort to the scan procedure furthermore encompasses the case where the period between two scan procedures has an appropriate scan transition indicator assigned to it. A scanning transition indicator may for example, be assigned to a group of scan procedures and thereby contain data regarding the scan transition period which applies to the entire group of adjustments, or all of the transition periods.

Various possibilities exist for this type of scan transition indicator. In the simplest case, such a scanning transition indicator may be of an adjustment applicability indicator, for example in the form of a "flag" having a certain bit value at a specific position in the data chain of the control protocol, or some other form or indicator. This adjustment applicability indicator would indicate, for example, if an adjustment may or may not be applied to a certain scanning procedure. This is useful when it is clear that two scannings are to be executed directly one after the other without a delay. It may be assigned to the previous scanning procedure, the subsequent scanning procedure, or the pair of scanning procedures, or the transition period of a respective adjustment applicability indicator, which indicates that under no circumstances may an adjustment be executed between the two scanning procedures.

In a preferred version of the method at least one scanning transition indicator contains a maximum transition time value, which gives a maximum transition time for the period between two scanning procedures. It can indicate, for each of a number of the necessary adjustments for the scanning procedure, an anticipated adjustment period required for the adjustments of a scanning procedure, and the adjustments will be executed only to the extent that they are necessary prior to a scanning procedure, or between the scanning procedures, as their total adjustment period is less than the maximum transition period value. Where applicable, further necessary adjustments are implemented in advance and/or appropriate adjustment parameters from previously executed adjustment readings will be used. If it is the case that, for example, only one adjustment is required, it will simply be checked to determine if this adjustment can be carried out within the maximum transition period. Only if this is the case can the adjustment be executed. Otherwise, it must be implemented in advance, if it is the case that appropriate adjustment parameters are not readily available from other scannings. It is clear that if such other adjustment parameters are available, the adjustment does not need to be executed, simply because it is possible within the maximum transition period.

For the calculation of the adjustment period and the maximum transition period value or for a comparison of these values, ideally an appropriate buffer period is incorporated, in order to allow the adjustment to be executed safely within the maximum transition period.

If it is the case that several adjustments are necessary for a scanning procedure, and there is neither sufficient time for the adjustments to be made, nor are adjustment parameters already available, a decision must be made as to which adjustments are to be executed, and which are not. For this purpose, a first criterion for the decision is whether the respective individual adjustments can be executed within the maximum transition time period allotted for said. Should a single adjustment take too long, it must be implemented in advance.

Ideally, the individual adjustments are assigned a cost value ("cost" meaning technical outlay or extra time), which corresponds to the additional cost required for the implementation of the respective adjustment. When the maximum transition period between to consecutive scan procedures is not sufficient for all of the necessary adjustments for a subsequent scan procedure to be executed, then ideally adjustments with a lower cost value are implemented. A significant criterion for this cost value may be whether or not the adjustment must be carried out at the same table position in relation to the magnetic field system as in the previous scanning procedure. In this case, the adjustment would be assigned a higher cost value, because otherwise the table must be brought to the same position twice, but the execution of an adjustment at the same position directly before the scanning procedure would not require this additional movement of the table.

In principle, the prioritized adjustments may be arranged anywhere within the total control signal sequence, where they do not further disrupt the scan procedure. Preferably, the prioritized adjustments are grouped in an adjustment sequence prior to the execution of the scan procedure.

As noted above, the adjustments may vary significantly; for example, these may be a transmitting coil adjustment and/or a transmitting frequency adjustment and/or a transmitter adjustment and/or a static magnetic field adjustment and/or a gradient coil adjustment. Furthermore, the "adjustment" may consist simply of calculations, which do not require an actual parameter change, but may still result in a delay and, for example, are necessary on the basis of previously executed adjustments and the parameters determined thereby, in order for a subsequent scan to be executed with the correct control parameters.

DESCRIPTION OF THE PREFERRED EMBODIMENTS

Figure 1:
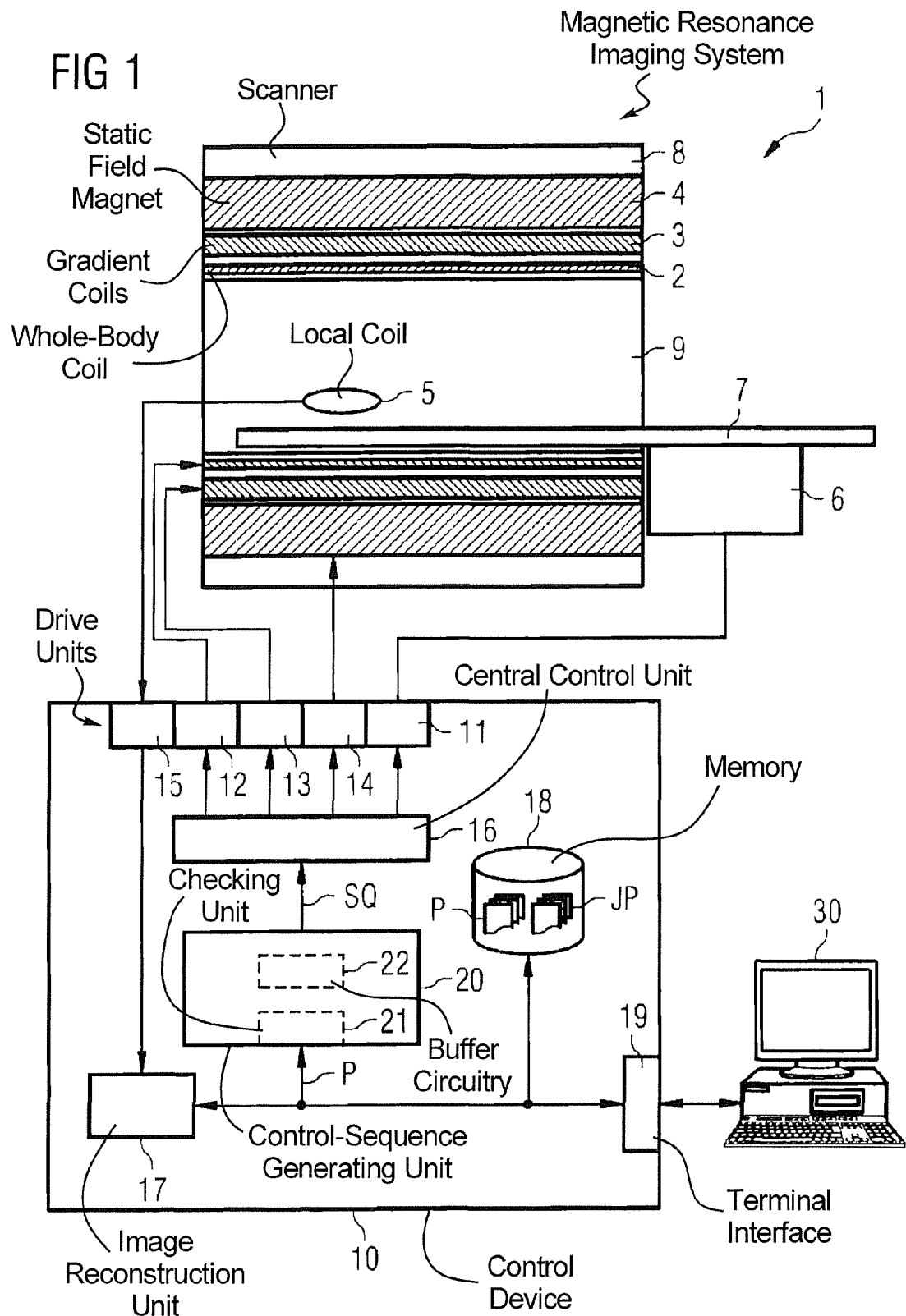
FIG. 1 schematically illustrates an embodiment of a magnetic resonance imaging scanner in accordance with the invention.

In FIG. 1 a rough schematic diagram of a magnetic resonance imaging system 1 is shown. It includes the actual magnetic resonance scanner (data acquisition unit) 8 having an examination space 9 or a patient tunnel therein. A table 7 is located on a base 6, so the table 7 may be transported within said patient tunnel 9, in order that the patient or other subject on the table during an examination can be located at a specific position within the magnetic resonance scanner 8 relative to the magnetic field system and radio frequency system therein, or may be moved during an adjustment between different positions. At this point it should be noted that the exact model of the magnetic resonance scanner 8 is not important. In this manner, for example, a cylindrical system with a typical patient tunnel may be used (as shown), but also a C-arm shaped magnetic resonance imaging scanner, whereby one side is open, may be used.

The basic components of the magnetic resonance scanner 8 are a static field magnet 4, a number of magnetic field gradient coils 3 and a whole-body radio frequency coil 2. These components are well known to those in the field of magnetic resonance imaging and for this reason are only shown schematically in FIG. 1. The reception of induced magnetic resonance signals in the object to be examined can occur with the whole-body coil 2, from which normally the radio frequency signals for inducing the magnetic resonance signals are transmitted. It is also possible, for example, to receive these signals with a local coil 5 placed on the object being examined. The gradient coils 3 and the static field magnet 4 form, together with their drive units 13, 14, the magnetic field system of the magnetic resonance imaging scanner 1, and the whole-body antenna 2 and, if applicable, the local coil 5 form, together with their drive units 12, 15, the radio frequency system (radio frequency transmission/reception system).

The individual components are operated by a control device 10, which is shown here in the form of a self contained block. The control device 10 may be a control computer that may be formed, where applicable, by spatially separate individual computers interconnected with appropriate cables or similar items. The control device 10, from which an operator is able to control the entire MRI scanner 1, is connected to a terminal 30 through a terminal interface 19.

This control device 10 includes, among other items, the gradient coils control device 13 and a static magnetic field control device 14, for the purpose of controlling the gradient coil system 3 and the static magnetic field system 4. The whole-body coil 2 is controlled through a radio frequency transmission/receiving unit 12 and (if used) the local coils 5 are read out through an additional radio frequency reception unit 15. A patient table control unit 11 is used to drive the patient table 7.

All of the control units 11, 12, 13, 14, 15 are coordinated through a central control unit 16, in order that the static magnetic fields, gradient fields and radio frequency pulses necessary for the execution of a scan can be synchronized for transmission, and the table 7 will be placed in the correct position. Furthermore, it must be ensured that the signal to the local coil 5 may be read by the radio frequency reception unit 15 and processed at the appropriate point in time.

The signals acquired in this manner are then supplied to an image reconstruction unit 17, in which the desired magnetic resonance images are reconstructed, in order that they may be, for example, displayed on the monitor of the terminal 30, or stored in a memory 18. The various components also used for executing the necessary adjustments are stored by the central control unit 16.

The magnetic resonance scanner 8 as well as the associated control device 10 contain, or may contain, numerous additional components that are not explained in detail herein. In particular, for example, the scanner 1 may also be connected through an appropriate interface to a network, such as a radiological information system (RIS), for the purpose of receiving control protocols which may be used with the scanner 1, or in order, for example, to send magnetic resonance image data generated by the scanner 1 to external bulk storage devices or to findings stations or printers or similar items.

In order to issue synchronized individual control commands to the respective control components 11, 12, 13, 14, 15, the central control unit 16 receives a control signal sequence SQ that determines the individual actions.

All of the scans are normally executed according to control protocols P, which can be stored in a memory 18 of the control device 10. An operator 30 can select a control protocol P, and where applicable, modify the protocol P and then allow the scan to be carried out, based on the control protocol P. In principle, the operator also has the possibility of developing a control protocol through the terminal 30 and to store the developed protocol. The control protocol P is necessary for controlling the apparatus, because in the online mode, it is not possible for the operator to enter all of the commands quickly enough, and thereby control the scanner 1. For this reason it is necessary for the entire sequence to be planned in advance and then to be processed using the control protocol P. A control sequence-generating unit 20 is used to generate the control signal sequence SQ on the basis of the control protocol P. This may be implemented, for example, in the form of software on a processor in the control device 10. It may also be realized as a part of the central control unit 16, as a modification to the system 1 in FIG. 1, or can be distributed among numerous components in various functioning processors working together. The control protocol P is read in the control sequence-generating unit 20, and a suitable control sequence SQ is created corresponding to these guidelines. Thereby, as explained above additional adjustments are inserted, if they are necessary between the individual scan procedures that are determined through the control protocol P, in order that the scan procedure may be correctly executed.

Figure 2:
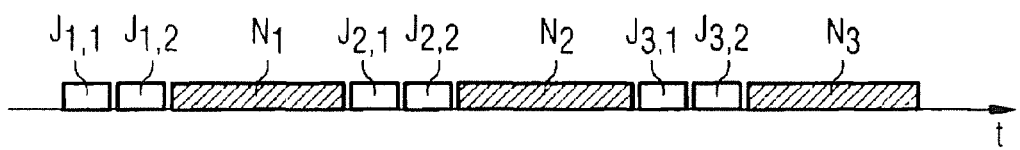
FIG. 2 schematically illustrates a scan sequence composed consisting of three scans, each of which has two adjustments implemented in advance, in accordance with the present state of technology.

FIG. 2 shows an example of how normally prior to various scan procedures $N_1$, $N_2$, $N_3$, in each case adjustments $J_{1.1}$, $J_{1.2}$, $J_{2.1}$, $J_{2.2}$, $J_{3.1}$, $J_{3.2}$ are executed.

In order to avoid always carrying out such adjustments prior to the scan procedures $N_1$, $N_2$, $N_3$, when a specific scan procedure is to directly follow a preceding scanning procedure as well, the possibility exists in accordance with the invention of placing a scan transition indicator U in the control protocol P.

Figure 3:
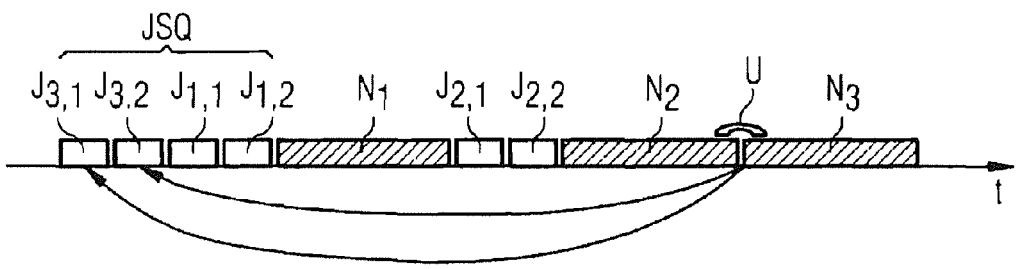
FIG. 3 schematically illustrates a first embodiment of a scanning sequence using the method of the invention with three scanning procedures and the necessary adjustments.

This is schematically indicated in FIG. 3 between the next to last scan procedure $N_2$ and the last scan procedure $N_3$ by a connecting arch. In the simplest case, the scan transition indicator U is formed by an appropriately placed bit within the data stream of the protocol, which signalizes that between the relevant scanning procedures $N_2$ and $N_3$, or prior to the scan procedure $N_3$, no adjustment may be executed. In the version shown in FIG. 1, the scan transition indicator U is recognized and interpreted by a scan transition checking unit 21 within the control protocol P, formed as a software submodule of the control sequence-generating unit 20. On the basis of the scanning transition indicator U, it is checked whether an adjustment is possible directly prior to a scanning procedure or between two scanning procedures.

The control sequence-generating unit 20 furthermore contains appropriate buffer circuitry 22 that takes into consideration the given conditions provided by the scan transition indicator U in the creation of the control sequence SQ, which then selectively prioritizes specific adjustments within the control sequence that absolutely must be executed for a scanning procedure.

FIG. 3 shows such a case. In this example, it is signalized by a scan transition indicator U located between the final two scan procedures $N_2$ and $N_3$ that at this point no adjustment should be executed. For this purpose, the control sequence SQ is constructed such that the adjustments $J_{3.1}$, $J_{3.2}$, which belong to the third scan procedure $N_3$, are to be placed at the beginning of the entire sequence. This means that an adjustment control sequence JSQ will be executed at the beginning, in which these adjustments $J_{3.1}$, $J_{3.2}$, and where applicable, together with the necessary adjustments $J_{1.1}$, $J_{1.2}$ prior to the first scan procedure $N_1$ are executed. In comparison, the adjustments $J_{2.1}$, $J_{2.2}$, which belong to the second scan procedure $N_2$, are not prioritized, since this scan procedure $N_2$ in this case does not need to be executed directly following the first scan sequence $N_1$.

Figure 4:
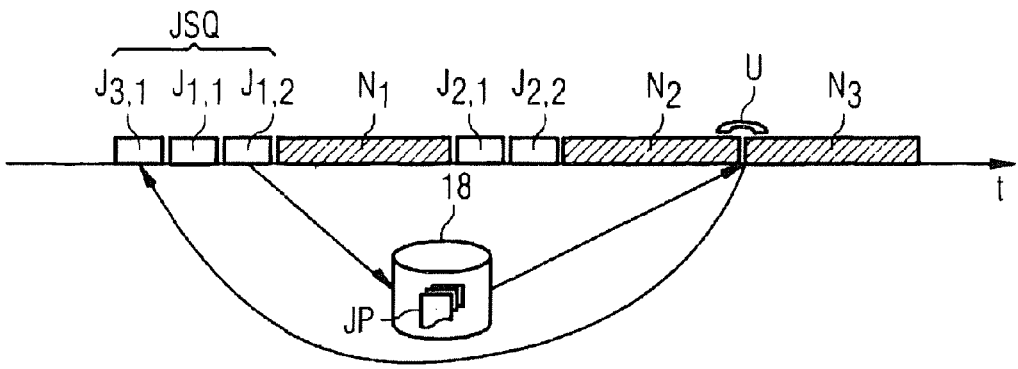
FIG. 4 schematically illustrates a second embodiment of a scanning sequence using the method of the invention with three scanning procedures and the necessary adjustments.

In order to avoid making unnecessary adjustments, the further possibility exists in the version presented in FIG. 1 of storing adjustment parameters values JP, for example from existing adjustments from other scan procedures, and then using the stored values JP for further, subsequent scanning procedures. This version is shown in FIG. 4. In this case, only the first adjustment $J_{3.1}$ of the third scan procedure $N_3$ is executed in advance. The second adjustment $J_{3.2}$ is similar or identical to the second adjustment $J_{1.2}$ of the first scan procedure $N_1$, such that the adjustment parameter obtained in the first scan procedure $N_1$ may be reused. This is indicated by the temporary storage and retrieval from the memory 18. As can be seen in FIG. 4, the process in accordance with the invention offers the possibility that not only can time delays between two scanning procedures $N_2$, $N_3$ be avoided in a simple manner, but also the total scanning time required can be reduced.

When it is the case that the possibility exists for a portion of the data for a specific alternative adjustment from another adjustment to be reused, and thereby shorten the relevant later adjustment, then, ideally, this possibility would be used. This means that where applicable, both adjustment parameter values from previously executed other adjustments assigned to scan procedures will be used as well as relevant adjustments—in this case however in shortened form—are given priority.

In many cases it is the case that scan procedures need not be executed directly after each other, but the time between two scan procedures may not be greater than a specific maximum period. In some cases a minimum period between two scan procedures must be observed. This means that two scan procedures are to be carried out within a very specific time period. In this case, it would be a waste of time if all of the adjustments that must be executed for a specific scanning procedure were executed in advance, particularly when a portion of these adjustments could be executed directly before the scan procedure. This is particularly illogical when the adjustments are to be executed with the table in the same table position as in the scan procedure itself. A prioritization of the adjustment would then have the disadvantage that this table position would have to be obtained unnecessarily obtained twice. The total scan time would thereby be unnecessarily increased.

Figure 5:
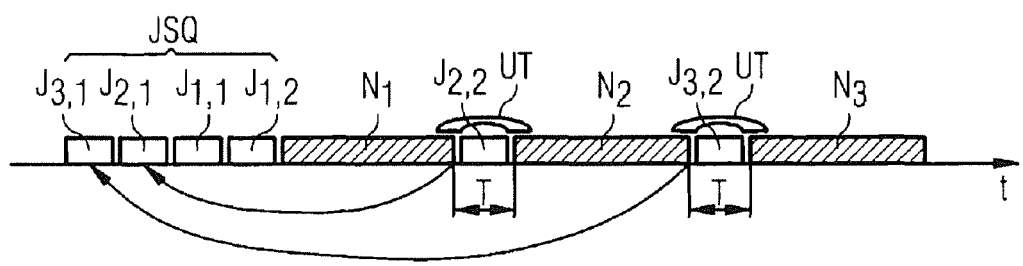
FIG. 5 schematically illustrates a third embodiment of a scanning sequence using the method of the invention with three scanning procedures and the necessary adjustments.

For this reason, the possibility exists in the illustrated embodiments to not only set simple scanning transition indicators in the form of adjustment applicability indicators U, but also to set scan transition indicators UT having a maximum transition period value, which gives a maximum transition time T for the period between two scan procedures. This is shown in FIG. 5. In each of these cases maximum transition times T are predetermined by the scan transition indicators UT between the first scan procedure $N_1$ and the second scan procedure $N_2$ as well as between the second scan procedure $N_2$ and the third scan procedure $N_3$ for the transition periods. The maximum transition times T are long enough that one of the two necessary adjustments can be executed. For this reason, only the first adjustments $J_{3.1}$, $J_{2.1}$ in each case in the adjustment sequence JSQ are placed at the beginning of the entire sequence, whereas the second adjustments $J_{2.2}$, $J_{3.2}$ in each case are executed directly prior to the respective scan procedures $N_2$, $N_3$. Ideally, these are adjustments in which the table is to be located at the same position as during the scan procedure.

Figure 6:
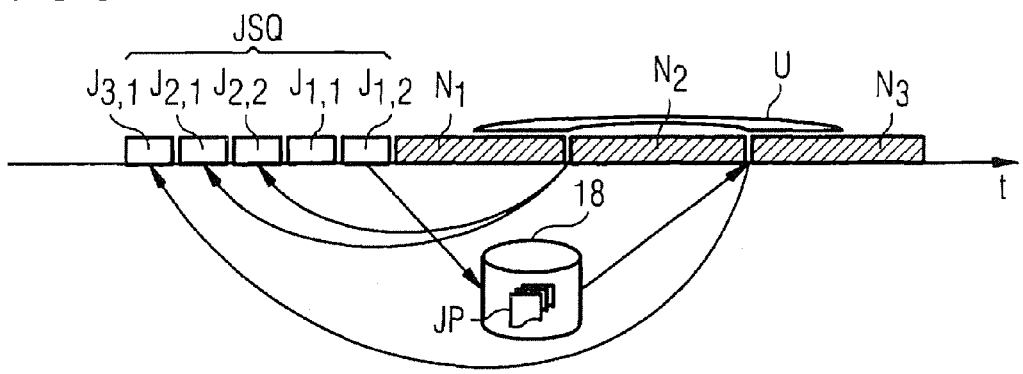
FIG. 6 schematically illustrates a fourth embodiment of a scanning sequence using the method of the invention with three scanning procedures and the necessary adjustments.

FIG. 6 shows another embodiment in which a complete group of scan procedures $N_1$, $N_2$, $N_3$ is marked with the use of a scanning transition indicator U. In this case, all of the scanning procedures $N_1$, $N_2$, $N_3$ are to be executed consecutively without a pause. For this purpose, all of the adjustments $J_{3.1}$, $J_{2.1}$, $J_{2.2}$, $J_{1.1}$, and $J_{1.2}$ are processed in advance in an adjustment sequence JSQ. Only the second adjustment $J_{3.2}$, necessary for the third scan procedure $N_3$ (compare with FIG. 2), is not executed at all here because the adjustment parameter value JP in memory 18 can be accessed, which in turn, within the framework of the second adjustment $J_{2.1}$, is ascertained for the first scan procedure $N_1$.

The examples above explain how the invention allows for an optimization of the entire control signal sequence SQ in a very flexible manner, and allows an operator to ensure, through the simple placing of scanning transition indicators U, UT within the control protocol, that the adjustments follow one another in the correct temporal spacing, uninfluenced by the system. An error-prone manipulation of the control protocol through modification of scan procedures or through the insertion of replacement, unnecessary scan procedures, in order to force a prioritization of adjustments, is no longer necessary. The total time requirement and thereby the inconvenience for the patient can thereby be optimized.

In summary, it should be noted that the embodiments described are only examples and the basic principle can be varied by those skilled in the art to a large degree without departing from the scope of the invention. Although the basic functioning of the invention is explained above based on the use of a magnetic resonance imaging scanner in the field of medicine, the invention is not limited only to such medical systems, but also can be used with other magnetic resonance apparatuses; for example for material testing or similar functions.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance imaging data acquisition unit, said magnetic resonance imaging data acquisition unit comprising a magnetic field system and a radio-frequency system and a computerized control unit that operates said magnetic resonance imaging data acquisition unit, said method comprising the steps of:

supplying a control protocol to said control unit that defines a plurality of scan procedures, comprising a first scan procedure followed in time-dependent sequence by a plurality of subsequent scanning procedures, and a plurality of adjustments for adjusting at least one of said magnetic field system and said radio-frequency system for each of said plurality of scan procedures;

in said control protocol, embedding a plurality of scan transition indicators respectively for each scan procedure in said plurality of scan procedures, each scan transition indicator comprising information selected from the group consisting of individual constraints for making said adjustment for an individual one of said plurality of subsequent scan procedures, and relative constraints on making respective adjustments to said scan procedures in said plurality of subsequent scan procedures due to the time-dependent sequence of said scan procedures in said plurality of subsequent scan procedures;

in said control unit, reading said control protocol, including said scan transition indicators, and generating a control time-dependent sequence therefrom that operates said magnetic resonance imaging data acquisition unit to execute all of said plurality of scan procedures in said time-dependent sequence; and in said control unit, automatically determining, from said information read from said scan transition indicators, whether each adjustment for each scan procedure in said plurality of subsequent scan procedures can be implemented while still preserving said time-dependent sequence and, if not, automatically taking an action in generating said control time-dependent sequence selected from the group consisting of causing an adjustment for at least one scan procedure in said plurality of subsequent scan procedures to be implemented in advance of executing said first scan procedure, and making the adjustment for at least one scan procedure in said plurality of subsequent scan procedures using an adjustment value from a previously-executed adjustment of one of said scan procedures in said plurality of scan procedures.

2. A method as claimed in claim 1 comprising including, as an individual constraint in at least one of said scan transition indicators, adjustment applicability information indicating whether one of said scan procedures in said plurality of scan procedures is capable of accommodating an adjustment.

3. A method as claimed in claim 1 comprising including a relative constraint in at least one of said scan transition indicators that defines a maximum transition time duration between two immediately succeeding scan procedures in said plurality of scan procedures and, in said control unit, automatically determining whether adjustments for a last of said two immediately succeeding scan procedures can be implemented within said maximum transition time duration and, if not, taking said at least one of said actions in generating said control sequence.

4. A method as claimed in claim 3 comprising, in said control unit, prioritizing said adjustments from said control protocol and assigning a cost value to each prioritized adjustment representing an additional cost associated with that prioritized adjustment arising due to said prioritizing of said adjustments and, if said maximum transition time duration does not permit all prioritized adjustments for one of said scan procedures in said plurality of scan procedures to be implemented, implementing adjustments having a lower cost value assigned thereto prior to implementing said first scan procedure.

5. A method as claimed in claim 4 wherein said magnetic resonance imaging data acquisition unit comprises a movable table that is displaceable through a plurality of different table positions, and assigning higher cost values respectively to prioritized adjustments for which a same table position of said patient table is necessary.

6. A method as claimed in claim 4 comprising grouping a plurality of said prioritized adjustments into an adjustment sequence group, and implementing all adjustments in said adjustment sequence group prior to implementing said first scanning procedure.

7. A method as claimed in claim 6 comprising assigning a scan transition indicator to a group of said scan procedures that is less than all of said plurality of scan procedures.

8. A method as claimed in claim 1 wherein said magnetic field system comprises a static magnetic field magnet that generates a static magnetic field, a gradient coil system that emits gradient fields, and wherein said radio-frequency system comprises a transmitting coil having a plurality of coil characteristics that emits radio-frequency energy at a transmitting frequency, and comprising selecting said adjustments in said control protocol from the group of adjustments consisting of adjusting at least one of said transmitting coil characteristics, adjusting said transmitting frequency, adjusting said static magnetic field, and adjusting at least one of said gradient fields.

9. A magnetic resonance apparatus comprising:

a magnetic resonance imaging data acquisition unit comprising a magnetic field system and a radio-frequency system;

a computerized control unit that operates said magnetic resonance imaging data acquisition unit;

said control unit having an input that supplies said control unit with a control protocol that defines a plurality of scan procedures, comprising a first scan procedure followed in time-dependent sequence by a plurality of subsequent scanning procedures, and a plurality of adjustments for adjusting at least one of said magnetic field system and said radio-frequency system for each of said plurality of scan procedures, and said control protocol being embedded with a plurality of scan transition indicators respectively for each scan procedure in said plurality of scan procedures, each scan transition indicator comprising information selected from the group consisting of individual constraints for making said adjustment for an individual one of said plurality of subsequent scan procedures, and relative constraints on making respective adjustments to said scan procedures in said plurality of subsequent scan procedures due to the time-dependent sequence of said scan procedures in said plurality of subsequent scan procedures;

said control unit being configured to read said control protocol, including said scan transition indicators, and to generate a control time-dependent sequence therefrom that operates said magnetic resonance imaging data acquisition unit to execute all of said plurality of scan procedures in said time-dependent sequence; and said control unit being configured to automatically determine, from said information read from said scan transition indicators, whether each adjustment for each scan procedure in said plurality of subsequent scan procedures can be implemented while still preserving said time-dependent sequence and, if not, to automatically take an action in generating said control time-dependent sequence selected from the group consisting of causing an adjustment for at least one scan procedure in said plurality of subsequent scan procedures to be implemented in advance of executing said first scan procedure, and making the adjustment for at least one scan procedure in said plurality of subsequent scan procedures using an adjustment value from a previously-executed adjustment of one of said scan procedures in said plurality of scan procedures.

10. A magnetic resonance apparatus as claimed in claim 9 comprising a memory accessible by said control unit in which adjustment parameter values are stored for said previously-executed adjustment, and wherein said control unit is configured to access said memory to retrieve the adjustment values stored therein.

11. A non-transitory, computer-readable storage medium encoded with programming instructions, said storage medium being loaded into a computerized control and operating unit of a magnetic resonance imaging data acquisition unit that comprises a magnetic field system and a radio-frequency system, said programming instructions causing said computerized control and operating system to:

receive a control protocol to said control unit that defines a plurality of scan procedures, comprising a first scan procedure followed in time-dependent sequence by a plurality of subsequent scanning procedures, and a plurality of adjustments for adjusting at least one of said magnetic field system and said radio-frequency system for each of said plurality of scan procedures, said control protocol being embedded with a plurality of scan transition indicators respectively for each scan procedure in said plurality of scan procedures, each scan transition indicator comprising information selected from the group consisting of individual constraints for making said adjustment for an individual one of said plurality of subsequent scan procedures, and relative constraints on making respective adjustments to said scan procedures in said plurality of subsequent scan procedures due to the time-dependent sequence of said scan procedures in said plurality of subsequent scan procedures;

read said control protocol, including said scan transition indicators, and generate a control time-dependent sequence therefrom that operates said magnetic resonance imaging data acquisition unit to execute all of said plurality of scan procedures in said time-dependent sequence; and automatically determine, from said information read from said scan transition indicators, whether each adjustment for each scan procedure in said plurality of subsequent scan procedures can be implemented while still preserving said time-dependent sequence and, if not, automatically take an action in generating said control time-dependent sequence selected from the group consisting of causing an adjustment for at least one scan procedure in said plurality of subsequent scan procedures to be implemented in advance of executing said first scan procedure, and making the adjustment for at least one scan procedure in said plurality of subsequent scan procedures using an adjustment value from a previously-executed adjustment of one of said scan procedures in said plurality of scan procedures.

* * * * *